United States Patent [19]

Dubroeucq et al.

[11] 4,370,026
[45] Jan. 25, 1983

[54] ILLUMINATING DEVICE FOR PROVIDING AN ILLUMINATION BEAM WITH ADJUSTABLE DISTRIBUTION OF INTENSITY AND A PATTERN-TRANSFER SYSTEM COMPRISING SUCH A DEVICE

[75] Inventors: Georges Dubroeucq; Michel Lacombat; Michèle Brevignon, all of Paris, France

[73] Assignee: Thomson-CSF, Paris, France

[21] Appl. No.: 184,817

[22] Filed: Sep. 8, 1980

[30] Foreign Application Priority Data

Sep. 10, 1979 [FR] France .................... 79 22587

[51] Int. Cl.³ .................. G02B 27/10; G03B 27/72
[52] U.S. Cl. .................... 350/163; 350/170; 350/174; 362/259; 355/71
[58] Field of Search ........... 350/174, 169, 163, 170; 362/259; 355/67, 71

[56] References Cited

U.S. PATENT DOCUMENTS 4,109,304  8/1978  Khvalovsky et al. ............. 362/259
4,139,479  1/1979  Dubroeucq et al. ............... 355/71
4,149,773  4/1979  Reid ................................. 350/163

FOREIGN PATENT DOCUMENTS 54-17744  2/1979  Japan ................................ 350/174

OTHER PUBLICATIONS

Beard, T. D. et al., *Jour. of App. Phys.*, vol. 41, No. 12, Nov. 1970, pp. 4927–4929.

*Primary Examiner*—Jon W. Henry
*Attorney, Agent, or Firm*—Oblon, Fisher, Spivak, McClelland & Maier

[57] ABSTRACT

Illuminating device comprising a laser source providing a coherent beam with gaussian distribution of intensity and means for separating the initial beam into four parts along two orthogonal directions, means for recombining the four parts resulting in their partial superimposition in a predetermined plane and means for averaging the interferences produced in the plane by the four parts.

2 Claims, 18 Drawing Figures

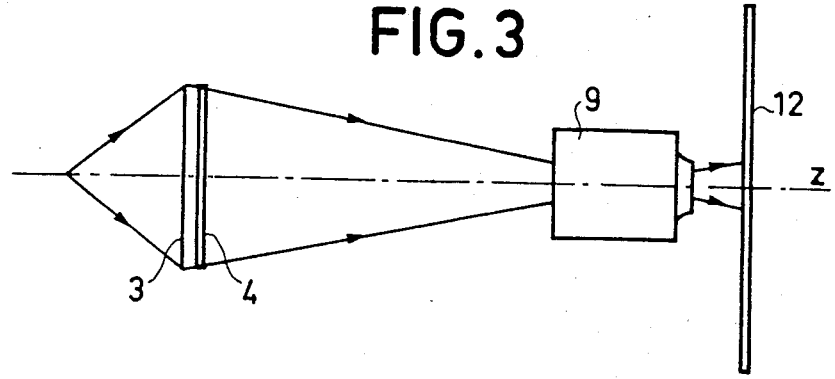
FIG. 3
FIG. 4
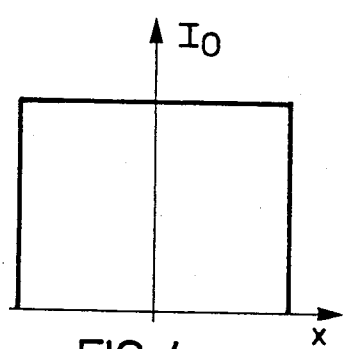
FIG. 4-a
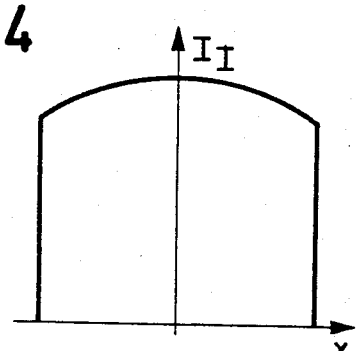
FIG. 4-b
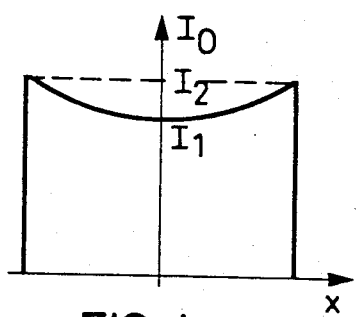
FIG. 4-c
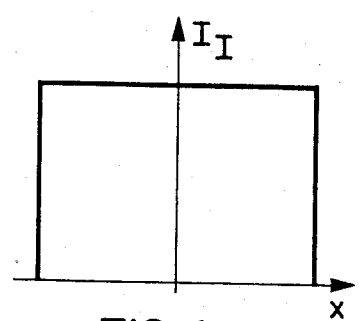
FIG. 4-d

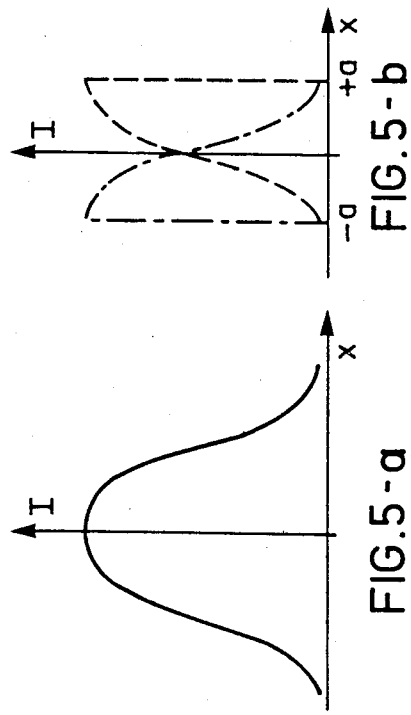
FIG. 5
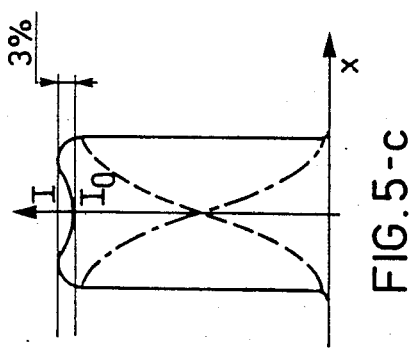
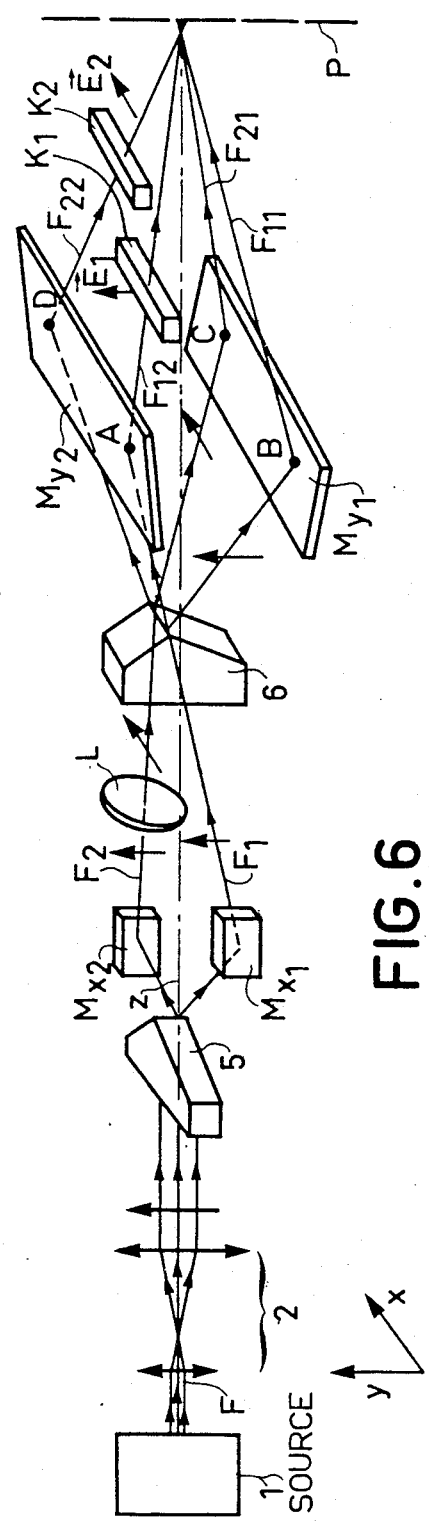

FIG.10
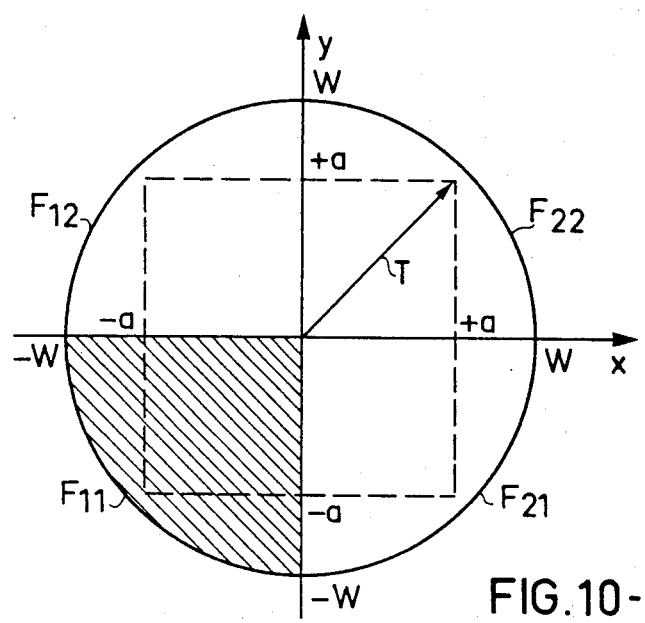
FIG.10-a
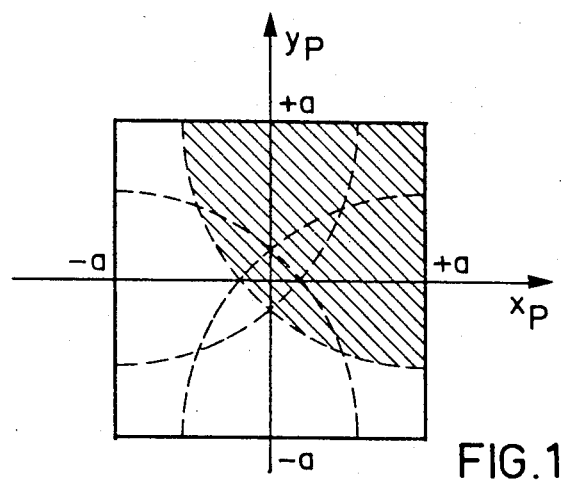
FIG.10-b

ILLUMINATING DEVICE FOR PROVIDING AN ILLUMINATION BEAM WITH ADJUSTABLE DISTRIBUTION OF INTENSITY AND A PATTERN-TRANSFER SYSTEM COMPRISING SUCH A DEVICE

BACKGROUND OF THE INVENTION

1. Field of the Invention

The present invention relates to an illuminating device for providing a substantially coherent illumination beam having a spatial intensity distribution adjustable at will.

2. Description of the Prior Art

A laser beam generally has a gaussian distribution of intensity with circular symmetry in accordance with the section due to the fact that only the fundamental mode resonates in the cavity. In an illuminating device for illuminating an object, for example in a pattern-projection system, the beam from the laser is made wider and divergent. It keeps its gaussian distribution so that the center of the object is illuminated more intensely than the edges. Now, to obtain a good image quality and also line widths identical in the whole field of the projection lens, particularly when the patterns are projected on a photosensitive resin, good uniformity of illumination is required in the image plane. Thus, in the case of production of integrated circuits by direct photorepetition, which comprises formation of a superimposition of levels in a semiconductor substrate, with successive maskings, the finest lines have a width of the order of a micron. Line width dispersion must be less than 10%, which implies illumination intensity variations less than 3%.

Different methods have been proposed for making an illumination uniform: the simplest method consists in widening the beam sufficiently so as to use only the center rays. This method, in order to be practical, has an energy efficiency of the order of 1%, which cancels out a great deal of the interest in using a laser. Other methods using generally the dispersion or the absorption of the beam also have a very low light efficiency. Some methods do not however have this disadvantage. A numerical hologram can be used traced by computer and approximating by a binary function the complex transformation giving a uniform spatial distribution from a gaussian distribution. This method is complex and costly to put into operation. Allowance may also be made for the fact that the gaussian distribution is due to the fact that the laser is monomode, and mirrors having a higher radius of curvature used for the laser, which allows other modes to resonate. An intensity distribution is obtained having a less marked maximum, but the illumination cannot be made sufficiently uniform by this means.

SUMMARY OF THE INVENTION

The present invention allows uniform illumination to be obtained within less than 5%, without energy loss, and using simple optical elements. Furthermore, the device of the invention allows the intensity distribution to be adjusted, within certain limits, so as to obtain non-uniform illumination, but corresponding to the best illumination of the image plane, depending on the faults of the optical projection system.

According to the invention, the illuminating device comprises means for separating the initial beam into four parts, along two radial directions perpendicular to each other, means for recombining the four parts resulting, in a predetermined plane (P), in partial superimposition of the four beams and means for averaging the interferences between the four parts so that the mean intensity in plane P is equal to the sum of the mean intensities of the four parts.

DESCRIPTION OF THE DRAWINGS

Other characteristics and advantages of the invention will appear clearly from the following description and the accompanying figures in which:

FIG. 3 shows schematically a pattern-projection device;

FIGS. 4a, 4b, 4c, and 4d illustrate the intensity distributions in the object and image planes;

FIGS. 5a, 5b, and 5c illustrate schematically the method used in accordance with the invention;

FIG. 6 shows one embodiment of the invention;

FIGS. 10a and 10b show the result obtained by the device of FIG. 6 or FIG. 9;

DESCRIPTION OF THE PREFERRED EMBODIMENT

Figure 1:
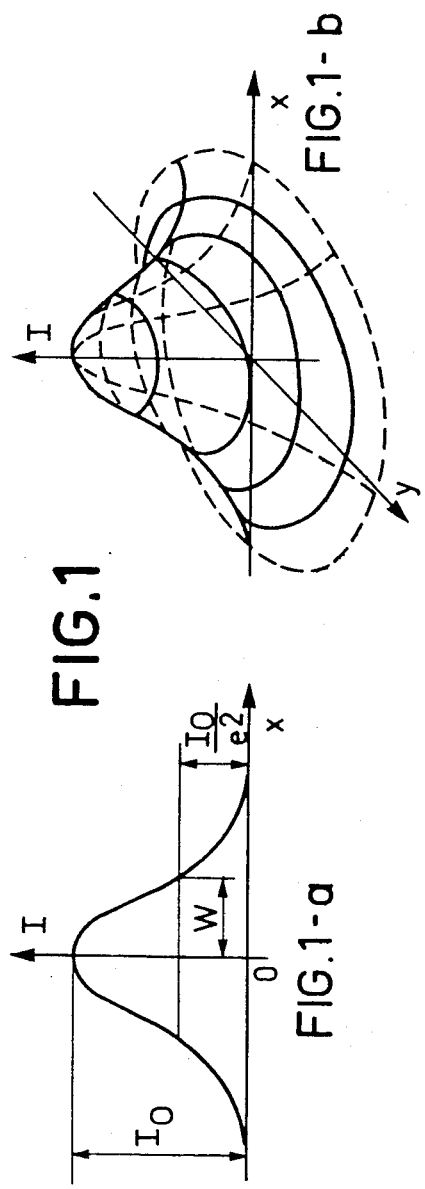
FIGS. 1a and 1b show the intensity distribution of a laser beam.

FIG. 1 shows the intensity distribution of a monomode laser beam. Such a beam is essentially characterized by its very low divergence (of the order of a milliradian) and a gaussian intensity distribution along the section of the beam. Thus, the rays close to the center of the beam are intense, the intensity along the central axis having a value $I_0$, whereas the rays at the edges of the beam are weak in intensity. The edges of the beam may be defined by their radial distance W, visible in FIG. 1a which will be called the radius of the beam so that the intensity is equal to $I_0/e^2$. FIG. 1b shows that the distribution has a circular symmetry along the section of the beam, formed by the plane (x, y).

Figure 2:
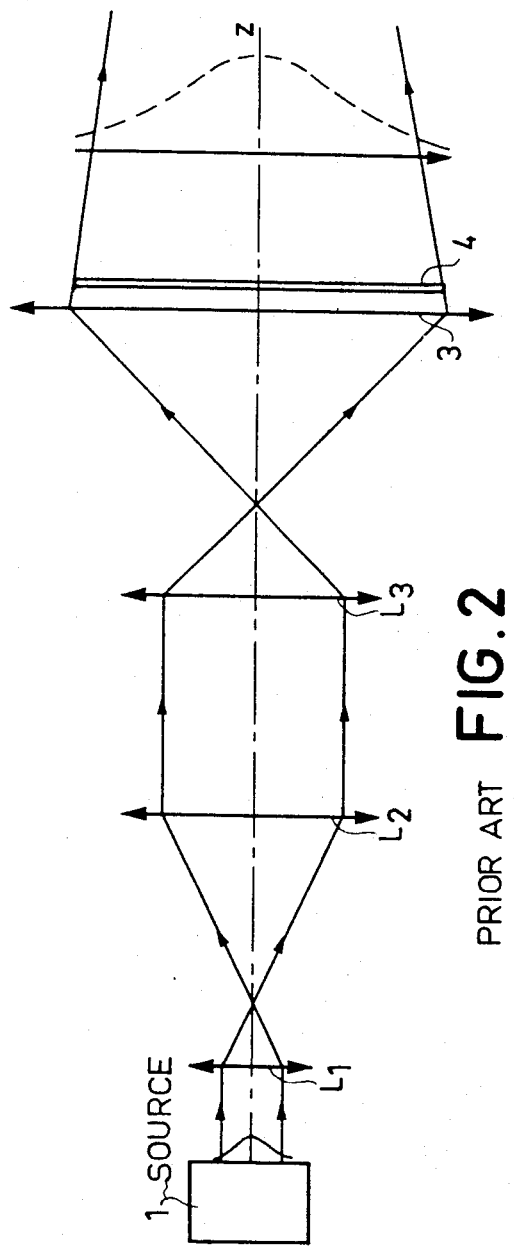
FIG. 2 shows schematically an illuminating device.

A laser beam may be used in an illuminating device such as the one shown by way of example in FIG. 2. The beam F delivered by laser 1 and having the intensity distribution shown in FIG. 1, is expanded by an expander formed of lenses $L_1$ and $L_2$. It is made divergent by a lens $L_3$ and condensed by a condenser 3 so as to illuminate an object 4. The intensity distribution in the plane of the object remains gaussian, so that the edges of the object are less illuminated than the center. Now, depending on the applications, it is desired to obtain a predetermined intensity distribution, adapted to the application.

One of the possible applications is shown in FIG. 3. This is a projection device comprising particularly an objective 9 forming the image of object 4 in a plane 12. So as to obtain good image quality over the whole field of the objective, good uniformity of illumination of the image plane is required.

FIG. 4 shows, in both cases, the intensity distributions obtained in the image plane. In the first case, the distribution in the object plane, shown in FIG. 4a, is uniform. It can then be generally seen that the illumination in the image plane shown in FIG. 4b is nonuniform, more intense at the center and diminishing gradually towards the edge of the field of the objective. This is due to the light losses in the different lenses which form objective 9 and which are in general greater at the edges than at the center, because of the spherical shape of the lenses. Consequently, so as to have in the image plane uniform illumination, such as shown in FIG. 4c, less intense at the center than at the edges, typically the maximum deviation $I_2/I_1$ between the intensity at the edge and at the center must be from 5% to 10%.

FIG. 5 shows schematically the method used in accordance with the invetion to obtain illumination of the type shown in FIG. 4c. It will be seen further on that the invention allows furthermore other forms of illumination to be obtained close to uniform illumination.

The original beam F has in every radial direction such as x a gaussian intensity distribution shown in FIG. 5a. The invention comprises separating this beam into two half-beams along an axial plane perpendicular to axis x, then shifting the two beams obtained by the same amount a in the opposite direction. The two half-beams are superimposed one on the other, as shown in FIG. 5b, and a resultant beam is obtained whose intensity distribution is shown in FIG. 3c, provided that the two half-beams are added together in intensity, and not in phase and in amplitude, which may be obtained for example, by rotating the polarization of one of the half-beams by 90°. It can be seen that the result is a substantially uniform distribution in the direction x. Calculations show that, for $a=0.555$ W, the maximum intensity deviation is 3%. On the other hand, the distribution remains gaussian along the radial axis y perpendicular to x. It is possible to effect the same separation-recombination along axis y, with the same value for the shift. Assuming that it has been arranged so that, in direction y as well, the beams are added together in intensity (the following description will show how that is possible), it can be shown that the shape of the beam approximates to a square, which is often advantageous for the useful fields for illuminating objects are often square, resulting in a gain in light efficiency. On the other hand, the intensity distribution is well-defined: weaker at the center, it increases gradually from $I_0$ to 103% $I_0$ towards the edge along axes x and y and from $I_0$ to 106% $I_0$ towards the edge along the diagonals. Such a beam supplies then an illumination close to the ideal illumination, shown in FIG. 4c.

FIG. 6 shows an optical assembly for providing the separation-recombination of a laser beam along two orthogonal directions, for the embodiment of the invention. The laser beam F delivered by laser 1 is widened by means of an expander 2. The separation along one axis x is ensured by a Fresnel biprism 5 suitably orientated and centered with respect to beam F. Beam F is thus separated into two half-beams $F_1$ and $F_2$. So as to lighten the figure, there have only been shown the rays resulting from the central ray of beam F, which forms the optical axis z of the system. Beams $F_1$ and $F_2$ are reflected respectively by two mirrors $M_{x1}$ and $M_{x2}$, so as to make them practically parallel to axis z. They then pass through a second Fresnel biprism 6, orientated orthogonally to biprism 5 and which provides separation of each beam $F_1$ and $F_2$ along axis y perpendicular to axis x, forming respectively beams $F_{11}$ and $F_{12}$, $F_{21}$ and $F_{22}$. Beams $F_{11}$ and $F_{21}$ are reflected by a mirror $M_{y1}$ and beams $F_{12}$ and $F_{22}$ are reflected by a mirror $M_{y2}$, so as to make them again substantially parallel to axis z. Mirrors $M_{y1}$ and $M_{y2}$ are placed so that the respecttive points of impact A, B, C, D of beams $F_{12}$, $F_{11}$, $F_{21}$ and $F_{22}$ are seen at the same inclination $\alpha$ with respect to azis z, in the recombination plane P of the beams. It is in this plane that the first lens $L_1$ of the illuminating device of FIG. 2 may be placed. So as to keep the overall collimating properties of the two lenses $L_1$ and $L_2$ of FIG. 2, angle $\alpha$ must be very small.

Figure 7:
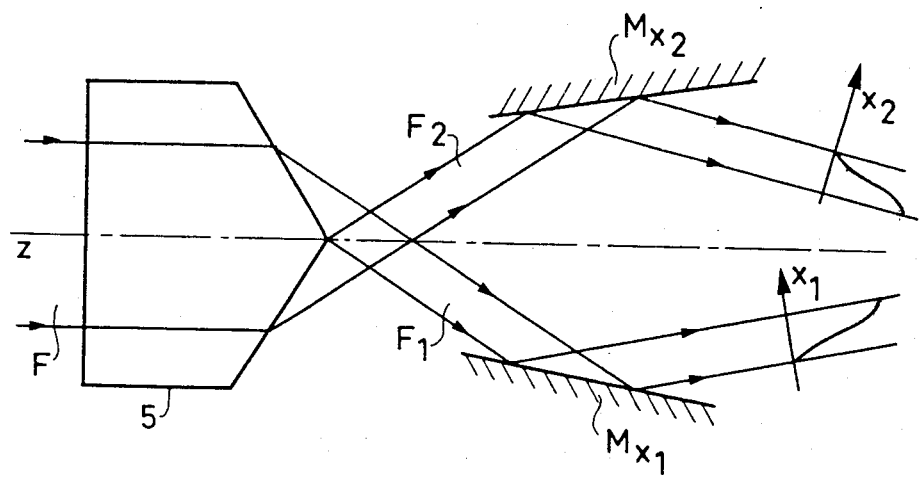
FIGS. 7 and 8 are partial detailed views.

The operation of the first separator formed by biprism 5 and mirrors $M_{x1}$ and $M_{x2}$ may be explained from the detailed view of FIG. 7. The beams obtained $F_1$ and $F_2$ have respectively, along axes $x_1$ and $x_2$ perpendicular to their direction of propagation, intensity distributions having a half-Gaussian form, such as shown in FIG. 5.

Figure 8:
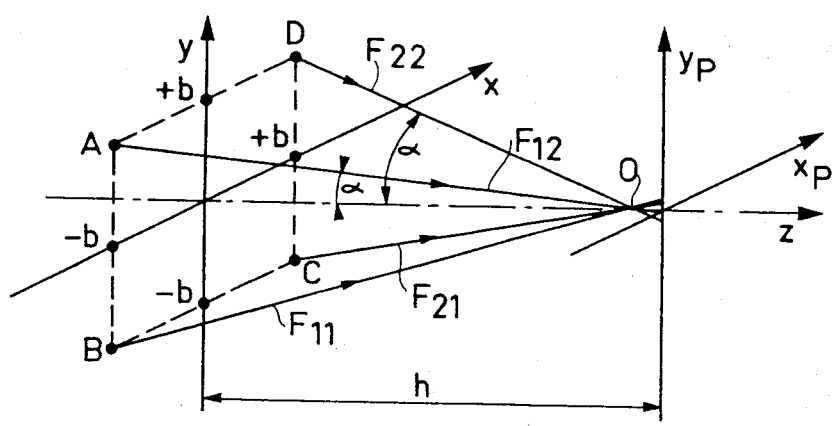

FIG. 8 shows the path of beams $F_{11}$, $F_{12}$, $F_{21}$ and $F_{22}$ on leaving the second separator, formed by biprism 6 and mirrors $M_{y1}$ and $M_{y2}$. The four points A, B, C, D form a square having a side 2b in a plane x, y perpendicular to the axis z centered on axis z. The rays of beams $F_{11}$, $F_{21}$, $F_{12}$ and $F_{22}$ coming from the central ray of the initial beam F form the same angle $\alpha$ with axis Z. These four beams form in plane P a system of interferences for the four sources are coherent between themselves because of the coherence of the laser. Since the four beams are not parallel to the optical axis, orthogonal fringes can be observed along axes $x_p$ and $y_p$ of plane P, forming a regular grid. By adjusting the polarization of the beams, one of the two systems of fringes can be removed. For example, if a half-wave blade L is placed in the path of beam $F_2$, since beam F is already polarized linearly, it can be arranged for beams $F_{22}$ and $F_{21}$, on the one hand, and $F_{11}$ and $F_{12}$, on the other hand, to be polarized respectively along directions $P_2$ and $P_1$ perpendicular to each other, and thus, they no longer interfere. However, these beams interfere with each other and form two independent fringe systems having the same direction and which are superimposed one on the other. For these two systems, it is necessary to know the phase distribution laws of the four beams, drawn from the phase laws of the different optical elements traversed: the halfwave blade and the two biprisms, reflection on the mirrors not modifying the phase distributions, and also the modification observed in plane P due to the inclination $\alpha$ of the beams, which depends on the value of angle $\alpha$, on b and on the distance h between the plane P and the square ABCD. The respective phase shifts of the four beams may then be calculated. If there is inserted into the path of one of the beams $F_{11}$ and $F_{12}$ a first electro-optical crystal $K_1$ polarized by an electric field parallel to the direction of polarization common to these two beams and whose value varies in time, an additional time variable phase shift $\phi$ may be introduced and the mean value of $\cos \phi$ adjusted over a time T which is small with respect to the time anticipated so that the illumination is zero. Calculation then shows that the mean value of the resultant intensity is equal to the sum of the intensities of each of the two beams. Similarly, there may be inserted in the path of one of the two beams $F_{21}$ and $F_{22}$ a second electrooptical crystal $K_2$ polarized by an electric field parallel to the direction of polarization common to these two beams and whose value varies in time, the same reasoning can be made and it can be shown that, when the mean value is considered, the two beams $F_{21}$ and $F_{22}$ are added together in intensity and not in amplitude and phase. Since the beams $F_{11}$ and $F_{12}$, on the one hand, $F_{21}$ and $F_{22}$, on the other hand, are added together in intensity, because of their perpendicular polarization, there is obtained, not exactly suppression of the interferences, but an averaging out in time, over a time sufficiently small with respect to the illumination or observation time for the illumination to be considered as homogeneous, for example insofar as its effects on the printing of a photosensitive resin are concerned.

The half-wave blade L and the electro-optical crystals $K_1$ and $K_2$ are shown in FIG. 6, as well as the directions of polarization of the beams, shown symbolically by arrows. Beam F is polarized parallel to axis y. Half-wave blade $F_2$ is placed in the path of beam L in a plane xy. Its neutral lines are orientated at 45° from axes x, y, so that, on leaving the blade, beam $F_2$ is polarized parallel to axis x. The crystal $K_1$ is placed in the path of beam $\vec{F}_{12}$ and it is controlled by a field $\vec{E}_1$ parallel to the polarization of this beam, so to axis y. It generates a phase shift $\phi_1$, which may for example be equal to $$\frac{\pi}{2} \cos \frac{2\pi t}{T}.$$

Crystal $K_2$ is placed in the path of beam $F_{22}$ and it is controlled by a field $\vec{E}_2$ parallel to the polarization of this beam, so to axis x. It generates a phase shift $\phi_2$, which may be in the form $$\phi_2 = \frac{\pi}{2} \cos \frac{2\pi t}{T} + \phi_0$$

where $\phi_0$ has any fixed value.

Figure 9:
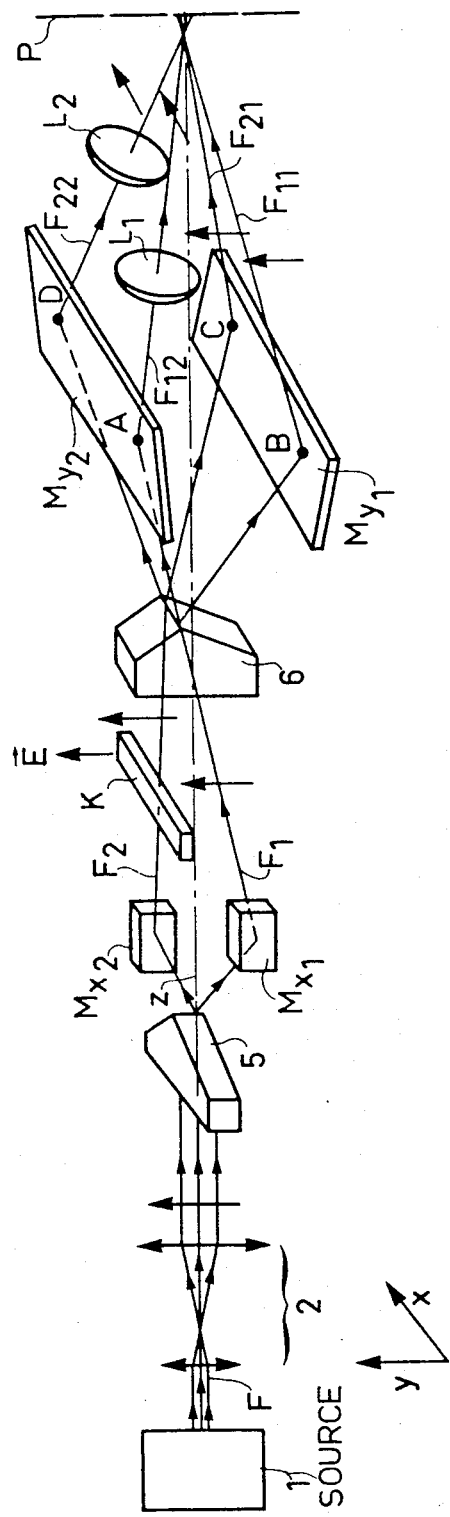
FIG. 9 shows a variation of the invention.

The same result of averaging out the interferences may be obtained by inverting the two means used: half-wave blade and phase-shifters. FIG. 9 shows the same optical assembly for separation-recombination of the beam, only the means for averaging out the interferences being different. With beam F still polarized along axis y, there is inserted into the path of beam $F_2$ a phase-shifter formed by an electro-optical crystal K polarized by an electric field $\vec{E}$ parallel to y, introducing a phase shift $\phi$ between beams $F_1$ and $F_2$ in the form $$\phi = \frac{\pi}{2} \frac{\cos 2\pi}{T}.$$

The directions of polarization of the beams remain unchanged.

A half-wave blade $L_1$ is introduced in the path of beam $F_{12}$ and a half-wave blade $L_2$ is introduced in the path of beam $F_{22}$, so that the polarizations of these two beams become parallel to axis x. Thus, in plane P, the two fringe systems are suppressed. This method is less expensive than the preceding one for it only uses one electro-optical phase-shifter instead of two.

Figure 11:
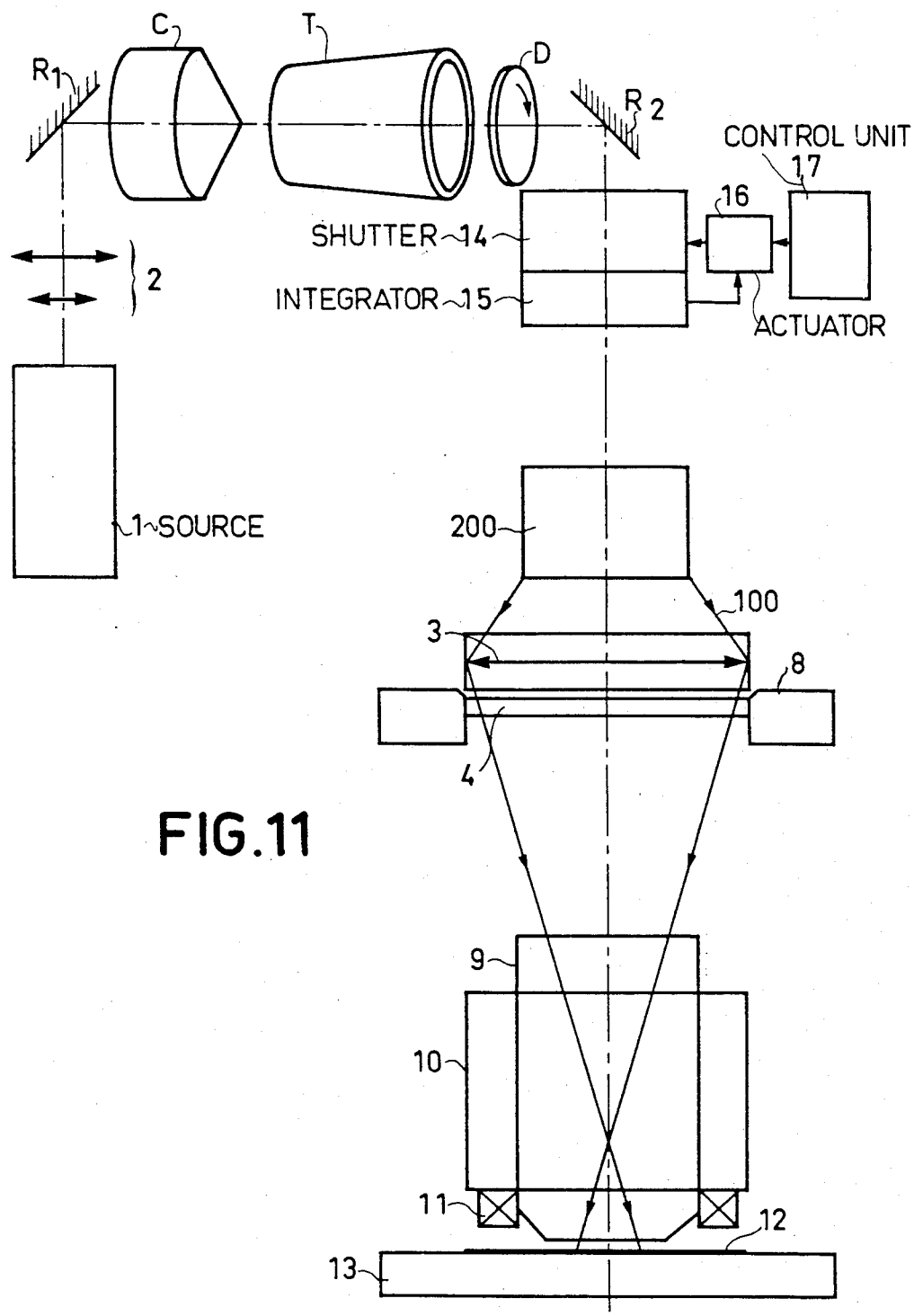
FIG. 11 shows one application of the invention.

Another possible method for removing the effect due to the interferences consists in placing in the path of the beams a rotating diffusing element which generates phase shifts variable in time, spatially random. This method will be advantageously used if, instead of constructing the two separators separately with, for each separator, a biprism and two mirrors, the separations-recombinations are effected respectively by means of a prism with circular symmetry, having a conical shape and a mirror in the shape of a truncated cone. It is a question of generalizing the process which has just been described. On exiting from the conical prism the beam is transformed into an annular beam and recombined by the conical mirror. Such means are illustrated in FIG. 11 which will be described further on.

In the case where the laser beam is not polarized linearly, the use of a birefringent is no longer possible unless a polarizer is placed in the path of the beam, which causes a 50% loss of energy. Four electrooptical phase-shifters may be placed in the path of the four beams creating respective phase shifts, for example in the form:

$$\phi_1 = \frac{\pi}{2} \cos \omega t,$$

$$\phi_2 = \frac{\pi}{2} \cos 2 \omega t,$$

$$\phi_3 = \frac{\pi}{2} \cos 3 \omega t,$$

$$\phi_4 = \frac{\pi}{2} \cos 4 \omega t,$$

where $T = \frac{2\pi}{\omega}$ is small with respect to the illumination time.

Whatever the means used on the one hand for providing separation-recombination of four beams, on the other hand for suppressing the effect of the interferences between the four beams, the separation and recombination are illustrated in FIGS. 10a and 10b. The section of beam F is shown in FIG. 10a. The device of the invention breaks this beam down into four sectors, then carries out translations of the type ($\pm a$, $\pm a$). Thus, beam $F_{11}$, hatched in the figure is translated along vector T (+a, +a). In plane P, shown in FIG. 10b, the four superimposed beams are inscribed in a square with side 2a centered on axis z.

The value of a is determined by the distance h. If plane P passes through the point 0 where the four rays coming from the central ray of beam F meet, there is no superimposition, a=0: beam F is reconstituted. The greater the distance h, the greater the superimposition. It has already been mentioned that, when a is of the order of 0.5 W, a substantially uniform intensity distribution is obtained. For lower values of a, the intensity distribution is in the form of a "horse saddle", i.e. the beam is intense on the edges and in the center, and less intense in the intermediate places. For greater values of a, the distribution is in the form of a basin: more intense at the edges than at the center.

An illuminating device comprising means for making the beam uniform is applicable particularly to a photorepeater.

FIG. 11 shows a photorepeater of the type described in French patent application No. 76.37.327 and published under the No. 2 406 236. Behind laser 1, for exampl a Krypton laser of a power of 1.5 W, are disposed the beam expander 2, a first reflecting mirror $R_1$ and uniformizing means formed by a conical prism C, a T-element in the shape of a truncated cone having reflecting walls and a rotating diffuser D. The beam having thus the desired intensity distribution is reflected by a second mirror $R_2$ towards a shutter 14 controlled so that the amount of energy received by the photosensitive resin layer intended to be printed corresponds to the best possible exposure. The control means described in the first application mentioned, are formed principally by an integrator 15, an energy-amount selector 17 and a comparator device 16 operating the opening and the closing of shutter 14. Then there are placed in the path of the beam means 200 for producing a substantially pin-point source having dimensions such that troublesome interference figures are not produced.

The divergent beam 100 leaving means 200 illuminates via a condenser 3 the object 4 carried by an object-holder 8 and the image of which is formed by the objective 9 carried by an objective 10 provided with automatic means 11 for focussing on substrate 12 covered with a photosensitive resin and carried by mobile table 13. The illumination obtained from conical prism C and the truncated cone-shaped mirror T allows, as has already been mentioned, good image quality to be obtained at the level of the photosensitive resin.

What is claimed is:

1. An illuminating device intended to supply a coherent illumination beam having an adjustable spatial distribution of intensity, from a source providing an initial beam having a gaussian distribution of intensity comprising means for separating the initial beam into four parts each forming a beam, along two radial directions perpendicular to each other, means for recombining the four parts resulting in a predetermined plane in partial superimposition of the four beams and means for averaging the interferences beween the four parts so that the mean intensity in the predetermined plane is equal to the sum of the mean intensities of the four parts wherein the separating means comprises a first biprism centered on the path of the initial beam and separating it along a first radial direction into two half-beams symmetrical with respect to the axis of the initial beam, and a second biprism centered on the path of the two half-beams and separating them respectively in a second radial direction perpendicular to the first one, into first and second parts symmetrical with respect to the first half-beam and into third and four parts symmetrical with respect to the second half-beam, wherein said recombining means comprises first and second mirrors reflecting respectively the two half-beams in two directions symmetrical with respect to the axis of the initial beam and converging towards the second biprism, and third and fourth mirrors reflecting respectively the two former parts and the two latter parts in four directions symmetrical with respect to the axis and converging towards the predetermined plane, and wherein, with the initial beam polarized linearly, the averaging means comprise at least one birefringent blade situated in the path of one of the half-beams so that these two-half beams have polarization directions perpendicular to each other, and at least two electrooptical phase-shifting situated respectively in the paths of one of the two former parts and of one of the two latter parts and introducing between the two former parts on the one hand and between the two latter parts on the other hand predetermined phase shifts variable in time, whose mean values, for times which are short with respect to the illumination duration, are zero.

2. An illuminating device intended to supply a coherent illumination beam having an adjustable spatial distribution of intensity, from a source providing an initial beam having a gaussian distribution of intensity comprising means for separating the initial beam into four parts each forming a beam, along two radial directions perpendicular to eah other, means for recombining the four parts resulting in a predetermined plane in partial superimposition of the four beams and means for averaging the interferences between the four parts so that the mean intensity in the predetermined plane is equal to the sum of the mean intensities of the four parts wherein the separating means comprises a first biprism centered on the path of the initial beam and separating it along a first radial direction into two half-beams symmetrical with respect to the axis of the initial beam, and a second biprism centered on the path of the two half-beams and separating them respectively in a second radial direction perpendicular to the first one, into first and second parts symmetrical with respect to the first half-beam and into third and four parts symmetrical with respect to the second half-beam, wherein said recombining means comprises first and second mirrors reflecting respectively the two half-beams in two directions symmetrical with respect to the axis of the initial beam and converging towards the second biprism, and third and fourth mirrors reflecting respectively the two former parts and the two latter parts in four directions symmetrical with respect to the axis and converging towards the predetermined plane, and wherein, with the initial beam polarized linearly, the averaging means comprise at least one electro-optical phase-shafting element situated in the path of one of the two half-beams introducing therebetween a predetermined phase shift variable in time and whose mean value is zero over a time which is short with respect to the illumination duration, and at least two birefringent blades situated respectively in the path of one of the two former parts and of one of the two latter parts and creating therein polarization rotations of 90° C.

* * * * *